United States Patent
Coumou et al.

(10) Patent No.: US 10,666,206 B2
(45) Date of Patent: May 26, 2020

(54) SUPERVISORY CONTROL OF RADIO FREQUENCY (RF) IMPEDANCE TUNING OPERATION

(71) Applicant: MKS Instruments, Inc., Andover, MA (US)

(72) Inventors: David J. Coumou, Webster, NY (US); Ross Reinhardt, Rochester, NY (US); Yuriy Elner, Pittsford, NY (US); Daniel M. Gill, Macedon, NY (US)

(73) Assignee: MKS Instruments, Inc., Andover, MA (US)

( * ) Notice: Subject to any disclaimer, the term of this patent is extended or adjusted under 35 U.S.C. 154(b) by 112 days.

(21) Appl. No.: 15/846,922

(22) Filed: Dec. 19, 2017

(65) Prior Publication Data

US 2018/0109230 A1   Apr. 19, 2018

Related U.S. Application Data

(62) Division of application No. 14/828,597, filed on Aug. 18, 2015, now Pat. No. 9,876,476.

(51) Int. Cl.
*H03F 1/56* (2006.01)
*H03F 3/195* (2006.01)
*H03F 3/24* (2006.01)

(52) U.S. Cl.
CPC .............. *H03F 1/56* (2013.01); *H03F 3/195* (2013.01); *H03F 3/245* (2013.01); *H03F 2200/378* (2013.01); *H03F 2200/387* (2013.01); *H03F 2200/451* (2013.01)

(58) Field of Classification Search
CPC ............. H03F 1/56; H03F 3/195; H03F 3/245
See application file for complete search history.

(56) References Cited

U.S. PATENT DOCUMENTS

| 2,745,067 A | 5/1956 | True et al. |
| 3,117,279 A | 1/1964 | Ludvigson et al. |
| 3,443,231 A | 5/1969 | Roza |

(Continued)

FOREIGN PATENT DOCUMENTS

| JP | 04299282 A | 10/1992 |
| JP | 09161994 A | 6/1997 |

(Continued)

OTHER PUBLICATIONS

Chinese Office Action for Application No. 201680048481.0 dated Jan. 28, 2019, and its English translation thereof.

(Continued)

*Primary Examiner* — Samuel S Outten
(74) *Attorney, Agent, or Firm* — Harness, Dickey & Pierce, P.L.C.

(57) ABSTRACT

A radio frequency (RF) control system including a RF generator having a power amplifier that outputs a RF signal and a controller. A matching network receives the RF signal and generates at least one RF output signal. In a first mode of operation, the controller enables adjustment of the frequency of the RF signal and a tune element of the matching network to achieve an impedance match and in a second mode of operation the controller enables adjustment of only the tune element of the matching network to achieve an impedance match while the frequency is adjusted to a target frequency. The RF controls system operates in a continuous and pulse mode of operation.

35 Claims, 4 Drawing Sheets

(56) References Cited

U.S. PATENT DOCUMENTS

| | | | |
|---|---|---|---|
| 3,601,717 | A | 8/1971 | Kuecken |
| 6,417,732 | B1 | 7/2002 | Radomski et al. |
| 6,818,562 | B2 | 11/2004 | Todorow et al. |
| 6,887,339 | B1 | 5/2005 | Goodman et al. |
| 7,199,678 | B2 | 4/2007 | Matsuno |
| 7,917,104 | B2 | 3/2011 | Manssen et al. |
| 8,217,731 | B2 | 7/2012 | McKinzie, III |
| 8,264,154 | B2 | 9/2012 | Banner et al. |
| 8,576,013 | B2 | 11/2013 | Coumou |
| 8,781,415 | B1 | 7/2014 | Coumou et al. |
| 9,408,288 | B2 | 8/2016 | Valcore, Jr. et al. |
| 9,536,749 | B2 | 1/2017 | Marakhtanov et al. |
| 2002/0080897 | A1 | 6/2002 | Main et al. |
| 2008/0061901 | A1 | 3/2008 | Gilmore |
| 2008/0158076 | A1 | 7/2008 | Walley |
| 2008/0274706 | A1 | 11/2008 | Blin |
| 2009/0278512 | A1 | 11/2009 | Karlicek et al. |
| 2009/0284156 | A1 | 11/2009 | Banna et al. |
| 2010/0270141 | A1 | 10/2010 | Carter et al. |
| 2011/0162798 | A1 | 7/2011 | Zhang et al. |
| 2013/0147681 | A1 | 6/2013 | Spears et al. |
| 2014/0097908 | A1 | 4/2014 | Fisk, II et al. |

FOREIGN PATENT DOCUMENTS

| | | | |
|---|---|---|---|
| JP | 3183914 | B2 | 7/2001 |
| JP | 2011-525682 | A | 9/2011 |
| TW | 201345326 | A | 11/2013 |
| WO | WO-2009/140371 | A2 | 11/2009 |
| WO | WO-2015/046753 | A1 | 4/2015 |

OTHER PUBLICATIONS

Extended European Search Report for European Patent Application No. 16837500.4 dated Mar. 13, 2019.

Coumou, David J., "Feedforward Power Distortion Correction in RF Power Delivery Systems for Plasma Processing Systems", 2012 18th IEEE-NPSS Real Time Conference (RT 2012): Berkeley, California, USA, Jun. 9-15, 2012, Jun. 1, 2012 (Jun. 1, 2012), pp. 1-5.

Taiwan Office Action for Application No. 105123174 dated Mar. 21, 2018, and its English translation thereof.

Advanced Energy Industries, Inc. "AE Paramount Generator: 13.56 MHz" User Manual, Sep. 2009.

Advanced Energy Industries, Inc. "AE Paramount® VHF" User Manual, Feb. 2012.

Advanced Energy Industries, Inc. "Optimized Process Performance Using the Paramount™/Navigator® Performance Power-Delivery/Match Solution" *Dan Carter, Advanced Energy® Industries, Inc.*

International Search Report for App. No. PCT/US2016/045953 dated Dec. 1, 2016.

Final Office Action for Taiwan Application No. 105123174 dated Dec. 22, 2018, and its English translation thereof.

International Preliminary Report on Patentability and Written Opinion of the Searching Authority for International Application No. PCT/US2016/045953, dated Mar. 1, 2018.

English translation of Japanese Office Action for Application No. 2018-508201 dated May 20, 2019.

European Office Action for European Application No. 16837500.4, dated Oct. 24, 2019.

European Office Action for European Patent App. No. 16837500.4 dated Mar. 17, 2020.

SUPERVISORY CONTROL OF RADIO FREQUENCY (RF) IMPEDANCE TUNING OPERATION

CROSS REFERENCE TO RELATED APPLICATIONS

This application is a divisional of U.S. patent application Ser. No. 14/828,597 filed on Aug. 18, 2015. The entire disclosure of the above application is incorporated herein by reference.

FIELD

The present disclosure relates to radio frequency (RF) power delivery systems and to supervisory control of RF impedance tuning operations.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. The electric field is generated based on RF power signals generated by a radio frequency (RF) generator of a RF power system. The RF power signals generated by the RF generator must be precisely controlled to effectively execute plasma etching.

A RF power system may include a RF generator, a matching network and a load (e.g., a plasma chamber). The RF generator generates RF power signals, which are received at the matching network. The matching network matches an input impedance of the matching network to a characteristic impedance of a transmission line between the RF generator and the matching network. This impedance matching aids in maximizing an amount of power forwarded to the matching network ("forward power") and minimizing an amount of power reflected back from the matching network to the RF generator ("reverse power"). Forward power may be maximized and reverse power may be minimized when the input impedance of the matching network matches the characteristic impedance of the transmission line.

In the RF power supply field, there are typically two approaches to applying the RF signal to the load. A first, more traditional approach is to apply a continuous wave signal to the load. In a continuous wave mode, the continuous wave signal is typically a sinusoidal wave that is output continuously by the power supply to the load. In the continuous wave approach, the RF signal assumes a sinusoidal output, and the amplitude and/or frequency of the sinusoidal wave can be varied in order to vary the output power applied to the load.

A second approach to applying the RF signal to the load involves pulsing the RF signal, rather than applying a continuous wave signal to the load. In a pulse mode of operation, a RF sinusoidal signal is modulated by a modulation signal in order to define an envelope for the modulated sinusoidal signal. In a conventional pulse modulation scheme, the RF sinusoidal signal typically is output at a constant frequency and amplitude. Power delivered to the load is varied by varying the modulation signal, rather than varying the sinusoidal, RF signal.

In a typical RF power supply configuration, output power applied to the load is determined by using sensors that measure the forward and reflected power or the voltage and current of the RF signal applied to the load. Either set of these signals is analyzed in a typical feedback loop. The analysis typically determines a power value which is used to adjust the output of the RF power supply in order to vary the power applied to the load. In a RF power delivery system, where the load is a plasma chamber, the varying impedance of the load causes a corresponding varying power applied to the load, as applied power is in part a function of the impedance of the load.

Further, the transition from continuous wave RF power delivery systems to pulse RF power delivery systems presents additional challenges. In a typical plasma system, the power dissipated in the plasma depends upon the impedance of the plasma. If the impedance varies in relation to the timescale of the RF pulse (typically in the range of 1 kHz-10 kHz), so as to not extinguish the plasma between pulse events, the sensors and actuators in the matching network and generator must respond on a similar timescale to provide optimal power coupling to the plasma load. Further, the time response of the impedance is plasma dependent and varies in accordance with factors such as chemistry, pressure, and power coupling. Further yet, the various parasitic elements outside of the plasma, such as resistive loss in the RF coupling antenna or the match system, present a time varying power coupling efficiency during the pulse cycle because they are a constant dissipated impedance in series with a time varying impedance load. Further yet, because the transmitted and reflected power sensors and RF generators are typically calibrated for a matched termination, power compensation due to impedance mismatch can contribute to increased variability in power delivery.

In the present, conventional control approach, the RF power supply and the matching network typically function independently. The RF power supply controls the RF frequency and power output to the matching network, and the matching network independently controls tuning of the match elements to provide an impedance match. In various conventional configurations, the impedance tuning operation is localized at the RF power supply, and the matching network generates and executes commands to perform actuation control. The impedance tuning control of conventional systems often result in competing considerations between power generation by the RF power supply and the matching function provided by the matching network.

The conventional RF control approach to treating RF power supply control and matching network control separately also presents various control complexities. For example, when attempting to achieve frequency correction by controlling impedance actuation devices in an impedance matching network, a conflicting control scenario can arise. The RF power supply attempts to regulate frequency and power while maintaining some measure of impedance tuning. Contemporaneously, the impedance matching network controls the impedance actuators to maintain a desired frequency output the RF power supply. Thus, a potential conflict arises between adjusting the RF power supply while maintaining an impedance match and, conversely, adjusting the impedance network while maintaining a desired target frequency output by RF power supply. Addressing these control complexities can enable improved RF power system control.

The challenges of such a configuration include maintaining a balance between potentially conflicting goals of frequency and power regulation and impedance tuning by the RF power supply with the often autonomous changes introduced by the impedance matching device in the impedance matching network in order to maintain a suitable match. A further challenge is introduced when measuring frequency in the impedance matching network in order to predict, but not control in a classic feedback approach, an appropriate adjustment of an impedance actuator of an impedance matching network in order to achieve the target frequency. Further, it is challenging to achieve process synchronization between frequency measurement and predicting a corresponding position of an actuator in the matching network in order to minimize the effect of impedance transient events. Further yet, realizing process repeatability and reproducibility in achieving target frequency becomes more difficult.

In present RF power generation systems, the frequency of the RF signal may be adjusted within a predetermined range about a selected target or center RF frequency in order to achieve an impedance match between the RF power generator and the load. Such frequency-based impedance tuning is referred to as automatic frequency tuning (AFT). In some AFT configurations, it is possible that the frequency of the RF signal can be adjusted towards a limit of a predetermined range of RF frequencies.

SUMMARY

This section provides a general summary of the disclosure, and is not a comprehensive disclosure of its full scope or all of its features.

A radio frequency (RF) control system includes a RF generator having a power amplifier that outputs a RF signal. The RF generator also includes a controller that varies a frequency of the RF signal. A matching network receives the RF signal. The matching network includes at least one impedance tuning element that is adjustable in accordance with commands communicated from the controller. In a first mode of operation, the controller enables adjustment of the frequency of the RF signal and the tuning element. In a second mode of operation, the controller inhibits adjustment of the frequency of the RF signal and enables adjustment of the impedance tuning element.

A radio frequency (RF) control system includes a RF generator having a power amplifier that outputs a RF signal. The RF generator generates a RF output signal to a matching network. The matching network receives the RF signal. The matching network includes at least one adjustable impedance tuning element. A controller varies a frequency of the RF signal and communicates commands to the matching network to adjust the impedance tuning element. In a first mode of operation, the controller adjusts the frequency of the RF signal and the tuning element. In a second mode of operation, the controller adjusts the frequency of the RF signal to a target frequency while adjusting the tuning element to an impedance match between the RF generator and a load.

A controller for a radio frequency (RF) control system is described. The RF control system includes a RF generator having a power amplifier that outputs a RF signal to a matching network. The matching network receives the RF signal, and the matching network includes at least one impedance tuning element. The controller varies a frequency of the RF signal and communicates commands to the matching network to adjust the impedance tuning element. In a first mode of operation, the controller adjusts the frequency of the RF signal and the tuning element to provide a match between the RF control system and a load. In a second mode of operation, the controller adjusts the impedance tuning element to provide a match between the RF control system and a load and inhibits adjusting the frequency of the RF signal to adjust the match, while adjusting the frequency of the RF signal.

A method for controlling a radio frequency (RF) system having a RF generator includes generating a RF signal and varying a frequency of the RF signal. In a first mode of operation, the method includes adjusting the frequency of the RF signal and a tuning element of a matching network. In a second mode of operation, the method includes adjusting only the tuning element while adjusting the frequency of the RF signal to a target frequency independently of a match condition.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings, and reference numbers may be reused to identify similar and/or identical elements.

DETAILED DESCRIPTION

Example embodiments will now be described more fully with reference to the accompanying drawings.

Figure 1:
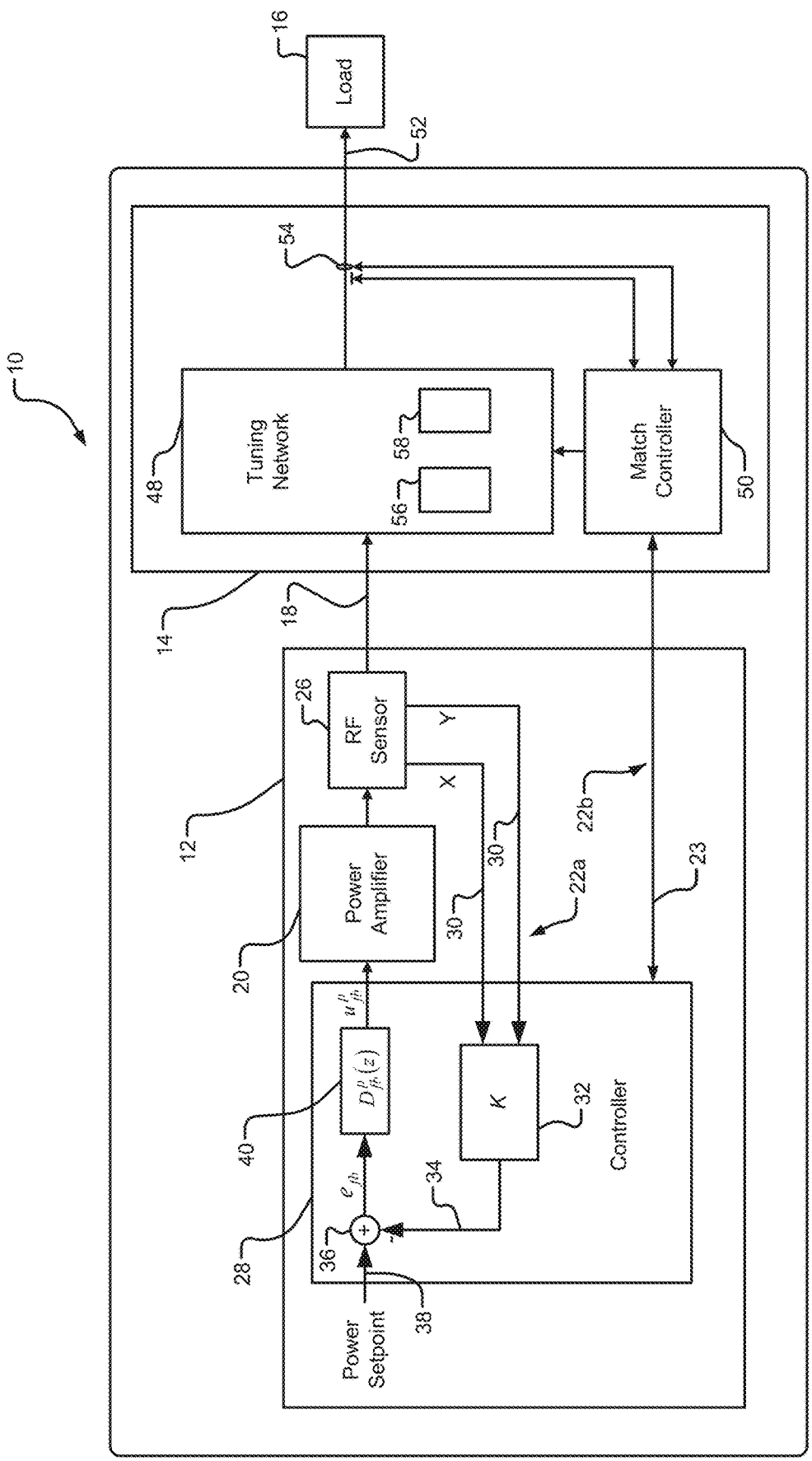
FIG. 1 depicts a functional block diagram of the RF power delivery control system incorporating the supervisory control of RF impedance tuning in accordance with the present disclosure.

In FIG. 1, a RF power system including a RF control or power system 10 is shown. RF power system 10 includes a RF generator 12, a matching network 14, and a load 16. RF generator 12 generates a RF power signal 18, which is provided to matching network 14. Matching network 14 matches an input impedance of matching network 14 to a characteristic impedance of a transmission line between the RF generator 12 and matching network 14. Put another way, matching network 14 matches an impedance of load 16 to an impedance as seen by the output of RF generator 12. Matching network 14 and load 16 may be considered as the load on the RF generator 12. Load 16 may be, for example, one or multiple plasma chambers or other RF loads, such as one or multiple electrodes of one or multiple plasma chambers. The impedance of load 16 may be static (i.e. unchanging over time) or dynamic (i.e. changing over time).

RF generator 12 includes a RF power source or power amplifier 20 and a first or internal feedback loop 22a and a second or external control loop 22b. Power amplifier 20 generates RF power signal 18, which is output to matching network 14. Power amplifier 20 may generate the RF power signal 18 based on a power signal received from a power source (not shown) external to power amplifier 20. The power source may be external to the RF generator 12. The power source may be, for example, a direct current (DC) power source.

First or internal feedback loop 22a includes one or more sensors (first sensors) 26 that generate signals X and Y (also 30) input to controller 28 of power amplifier 20. Internal feedback loop 22a also includes a scaling module 32, a summer 36, and a power control module 40, all of which are also part of controller 28. Sensors 26 may include voltage, current, and/or directional coupler sensors. Sensors 26 may detect (i) voltage V and current/output of power amplifier 20, and/or (ii) forward (or source) power $P_{FWD}$ out of power amplifier 20 and/or RF generator 12 and reverse (or reflected) power $P_{REV}$ received from matching network 14. The voltage V, current I, forward power $P_{FWD}$, and reverse power $P_{REV}$ may be scaled and/or filtered versions of the actual voltage, current, forward power, and reverse power of the output of the power amplifier 20. Sensors 26 may be analog and/or digital sensors. In a digital implementation, the sensors 26 may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 26 generate sensor signals X, Y, which are received by scaling module 32. Scaling module 32 scales sensor signals 30 and generates a power feedback signal 34. Power feedback signal 34 is generated based on the sensor signals 30 and a scaling matrix. The power feedback signal 34 may, for example, represent the forward power for forward power leveling power delivery. Power feedback signal 34 may represent the RF power transferred to the matching network 14 or load power $P_d$ and can be represented by equation (1), where V is voltage output of the power amplifier 20 and/or RF generator 12, I is current out of the power amplifier 20 and/or RF generator 12, and Θ is a phase difference between the voltage and the current outputs V, I of the power amplifier 20.

$$P_d=|V||I|\cos(\Theta)=P_{FWD}-P_{REV} \quad (1)$$

Summer 36 sums the power feedback signal 34 with a predetermined power setpoint signal 38, which may be generated by a power setpoint module (not shown). Power feedback signal 34 may be subtracted from the predetermined power setpoint signal 38 to generate an error signal $e_{fb}$.

Power control module 40 receives the error signal $e_{fb}$ and generates a power control signal $u_{fb}^p$ to regulate power out of power amplifier 20. Power control signal $u_{fb}^p$ is provided to power amplifier 20. Power amplifier 20 adjusts RF power signal 18 based on power control signal $u_{fb}^p$. RF power signal 18 may be a continuous waveform or a pulse waveform. Power control module 40 may include a proportional integral derivative (PID) controller or subset thereof and/or a direct digital synthesis (DDS) component(s). In various implementations, power control module 40 is a first PID controller or subset thereof with a function identified as $D_{fb}^p(z)$. Power control signal $u_{fb}^p$ may be a drive signal and have a DC offset or rail voltage, a frequency, and a phase.

Matching network 14 includes a tuning network 48 and a match controller 50. Tuning network 48 includes tuning elements for varying the impedance at the output of RF generator 12 in order to respond to variations in load 16 and maintain a stable impedance at the output of RF generator 12. Tuning network 48, for example, includes one or both of a first match tuning element 56 and a second match tuning element 58, each of which are adjustable in order to vary the impedance at matching network 14 to tune to and maintain a match condition. In various embodiments, tuning network 48 includes one or both of a load capacitance (sometimes referred to as $C_1$ or $C_L$) that corresponds to first tune element 56 and a tune capacitance (sometimes referred to as $C_2$ or $C_T$) that corresponds to second tune element 58. Each of the tune capacitance and the load capacitance are adjustable in order to vary the impedance at matching network 14 to tune to and maintain a match condition.

Matching network 14 also includes a RF sensor 54 associated with a transmission line 52 for sensing the respective characteristics of the RF power output by tuning network 48. RF sensor 54 operates similarly as described with respect to RF sensor 26 of RF generator 12. RF sensor 54 generates signals that vary in accordance with the RF power applied to transmission line 52, and the signals are input to match controller 50. Match controller 50 communicates a characteristic signal that varies in accordance with the information sensed by RF sensor 54 to controller 28 of RF generator 12 over communication link 23.

Various techniques are disclosed herein that include maximizing optimal power transfer in a RF power system with a dynamic load (i.e. a load having varying impedance(s)). A first technique includes RF power amplifier 20 connected to matching network 14. Matching network 14 may include an impedance tuning network 48 to effect impedance matching between RF generator 12 match network 14. For example, tuning network 48 includes two or more variable tuning elements 56, 58, such as variable capacitors. Variable tuning elements 56, 58 may be in a 'L'-configuration (one load capacitance in parallel with RF generator 12 and one tune capacitance in series with load 16). Variable tuning elements 56, 58 adjust tune and load parameters of the matching network 14, and may have, respectively, an associated tune input and load input. The tune and load parameters refer to impedance adjustments performed in matching network 14 via the variable tuning elements. As an example, the tune parameter and the load parameter may be associated with respective capacitances of capacitors in matching network 14, such as $C_1$ and $C_2$, respectively. In various embodiments, a second technique introduces a variable frequency adjustment to the power amplifier 20 and may be used alternatively or in combination with the first technique. The tune and load parameters may each be fixed, discretely selectable, and/or adjustable when using the second technique.

In both the first and second techniques, the RF power transferred $P_d$ from the power amplifier 20 to the matching network 14 is maximized. This may occur when the forward power $P_{FWD}$ to the matching network 14 is maximized and/or the reverse power $P_{REV}$ from the matching network is minimized. The RF power transferred $P_d$ may be represented by equation (2). A maximum RF power transferred $P_{MAX}$ may be represented by equation (3).

$$P_d=|V||I|\cos(\Theta) \quad (2)$$

$$P_{MAX}=\max\,(|V||I|\cos(\Theta))=\max\,(P_{FWD})-\min\,(P_{REV}) \quad (3)$$

The RF power transferred $P_d$ is maximized when the phase Θ is as close to zero as systematically achievable for a RF power system 10 providing power to a reactive load or reactive impedance (e.g. load 16). The first and second techniques minimize the phase Θ by adjusting the tune and load parameters of the matching network 14. Since the phase Θ is dependent on the reactive impedance, reduction in the phase Θ is a function of frequency f of the power amplifier 20. As a result, phase reduction can be performed as a function of the frequency f or in other words, the phase Θ can be reduced to or nearly 0 by adjusting the frequency f of the power amplifier 20 and thus the output frequency f of the power amplifier 20.

As mentioned above, in various embodiments, RF generator 12 also includes a second or external control loop 22*b*. Second control loop 22*b* includes sensor 54, match controller 50, and power control module 40 of controller 28. As described above, sensor 54 generates signals similar to X and Y output by RF sensor 26. The signals output by sensor 54 are input to match controller 50. Match controller 50 processes the received signals and outputs information characteristic of the signals to controller 28 of RF generator 12. The information output by match controller 50 is output in a digital format to controller 28. In one configuration, a matching network operates independently of the RF generator includes circuitry to adjust the respective tuning element or elements in accordance with the determined match condition.

In another configuration, RF generator 12 controls both the tuning elements 56, 58 in a unified manner via controller 28 of RF generator 12. Control of the first tuning element 56 and second tuning element 58 is described in U.S. Pat. No. 8,576,013 entitled Power Distortion-Based Servo Control Systems for Frequency Tuning RF Power Sources, granted Nov. 5, 2013, and assigned to the assignee of the present application. Control of the first tuning element 56 and second tuning element 58 can occur when controller 28 communicates a tune control signal to match controller 50 to effect tuning of the respective first tuning element 56 and second tuning element 58.

Power control module 40 of controller 28 utilizes the information received from match controller 50, in second control loop 22*b*, received from RF sensor 54. Match controller 50 communicates with controller 28 in various embodiments at fixed data rates and link latency to provide information characterizing the outputs to load 16.

In various embodiments RF generator 12 executes supervisory control over the RF signal output by power amplifier 20 and match network 14. In a first mode, supervisory control of match network 14 includes maintaining a match condition by adjusting the frequency of the RF signal and generating commands to matching network 14 to control one or both of first tuning element 56 and second tuning element 58. In a second mode, supervisory control includes generating commands to match controller 50 of matching network 14 to control one or both of the first tuning element 56 and second tuning element 58 to maintain a match, while the RF frequency is adjusted to a target frequency. In the second mode, the frequency adjustment is to a target frequency, leaving matching network 14 to maintain a match condition. The supervisory control approach described above may be generalized to both the continuous wave and a pulse mode operation of RF generator 12.

Figure 2:
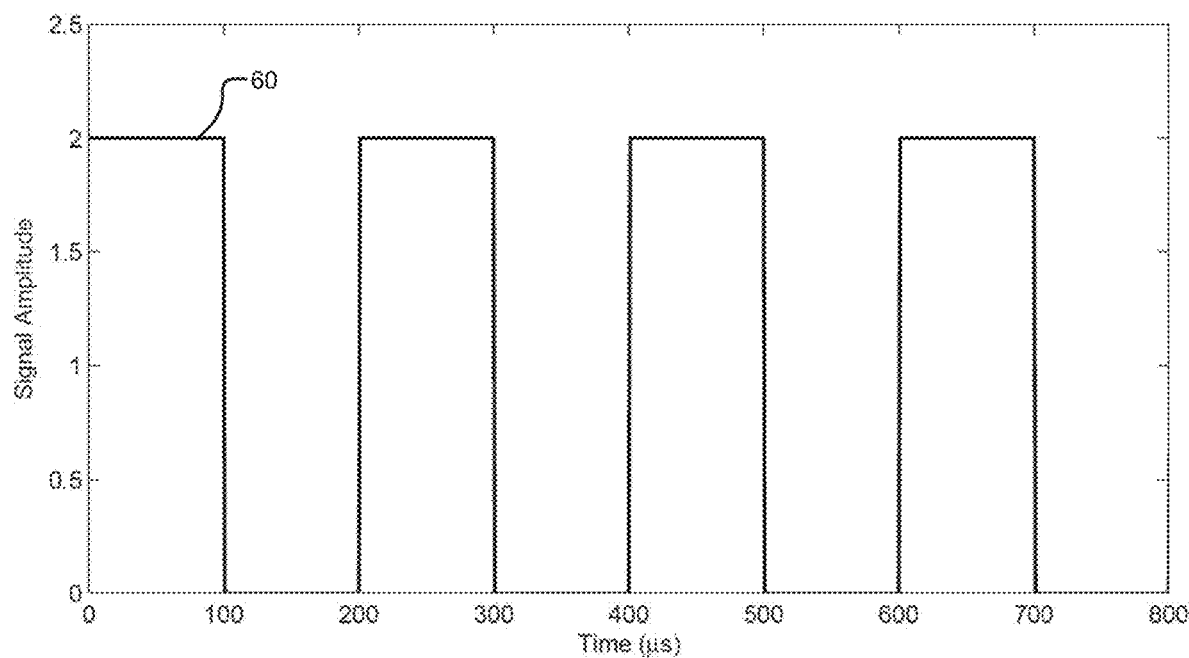
FIG. 2 depicts a waveform of an exemplary output pulse of a pulse mode control of a RF power delivery system.
Figure 3:
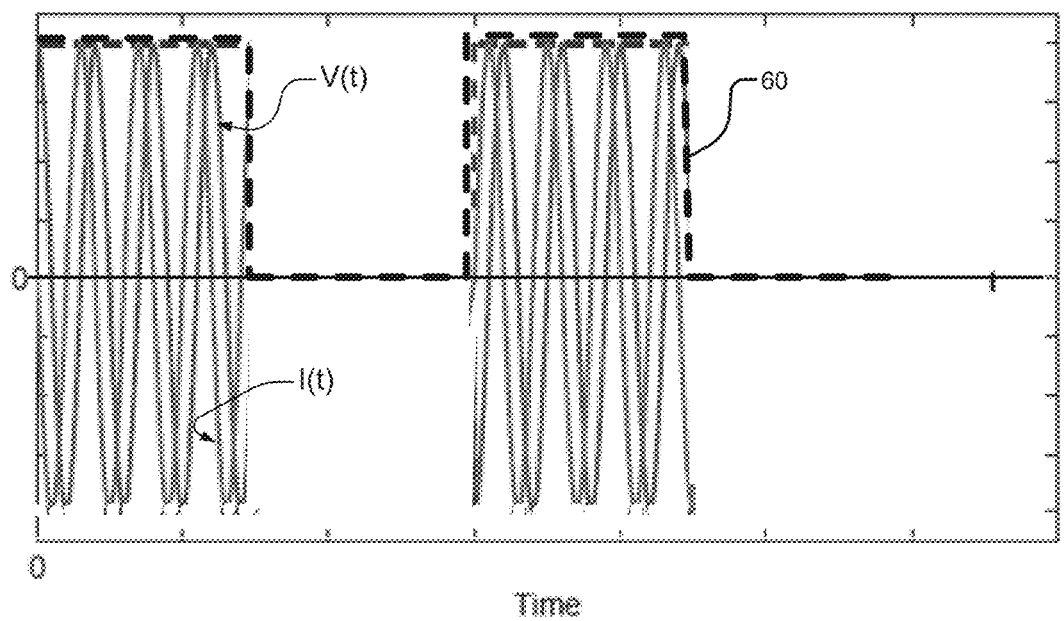
FIG. 3 depicts a pulse and exemplary waveforms bounded by the pulse in accordance with operation of a RF power deliver system in a pulse mode of operation.

With reference to a pulse mode of operation, FIG. 2 depicts a pulse waveform 60, such as may be output on transmission line 52. In one non-limiting example, as shown in FIG. 2, pulse waveform 60 has a frequency or pulse repetition frequency (PRF) of 500 kHz, or a pulse rate time ($t_p$) of 200 μs. FIG. 3. depicts a general representation of a pulse waveform 60. As can be seen in FIG. 3, pulse waveform 60 provides an envelope for a sinusoidal voltage signal V(t) and sinusoidal current signal I(t), so that when waveform 60 is on, the sinusoidal signals V(t) and I(t) are bounded by waveform 60 and may be output. When waveform 60 is off (having an amplitude of zero), no output occurs and sinusoidal signals V(t) and I(t) are both zero. Although pulse waveform 60 shown in FIG. 2, is represented as a square wave, pulse waveform 60 may be a square, sawtooth, triangular, bi-level or multi-level, and other wave shapes. Pulse waveform 60 is periodic in various embodiments.

As will be described in greater detail herein, supervisory control of frequency is the combination of (1) regulating the RF frequency to allow impedance tuning by an agile-frequency RF power supply and (2) controlling the frequency to a desired target or center frequency. Put another way, when employing frequency tuning, the frequency of an agile-frequency RF power supply is varied in response to transient impedance conditions, such as ignition, power changes, chemistry flow variation, and pressure fluctuations. Such frequency-based impedance control is often referred to as automatic frequency tuning (AFT). After the impedance tuning operation is completed through AFT, supervisory control returns the frequency of the RF power supply to a desired or center frequency while maintaining a match.

Supervisory control thus provides an implied time reference to the frequency tuning and frequency adjustment sequences, enabling the controller to coherently operate under all process conditions. Using the approach as described herein, supervisory frequency control can be performed combining a conventional approach of using a RF generator to provide an AFT operation coupled with an automatic impedance tuning device, such as a matching network. In the alternative, supervisory control can be accomplished with centralized power regulation and an impedance tuning operation. In the latter approach, the matching network, such as matching network 14, provides position control of the reactive elements for impedance tuning. For example, a controller may provide traditional feedback power control and position control updates to the matching network for the reactive elements used for impedance tuning. The impedance tuning can include adjusting first tuning element 56 and second tuning element 58 in accordance with commands generated centrally by controller 28 or in accordance with commands generated by match controller 50. Supervisory control combines match control and controlled correction to a desired or target frequency in response to frequency excursions.

Figure 4:
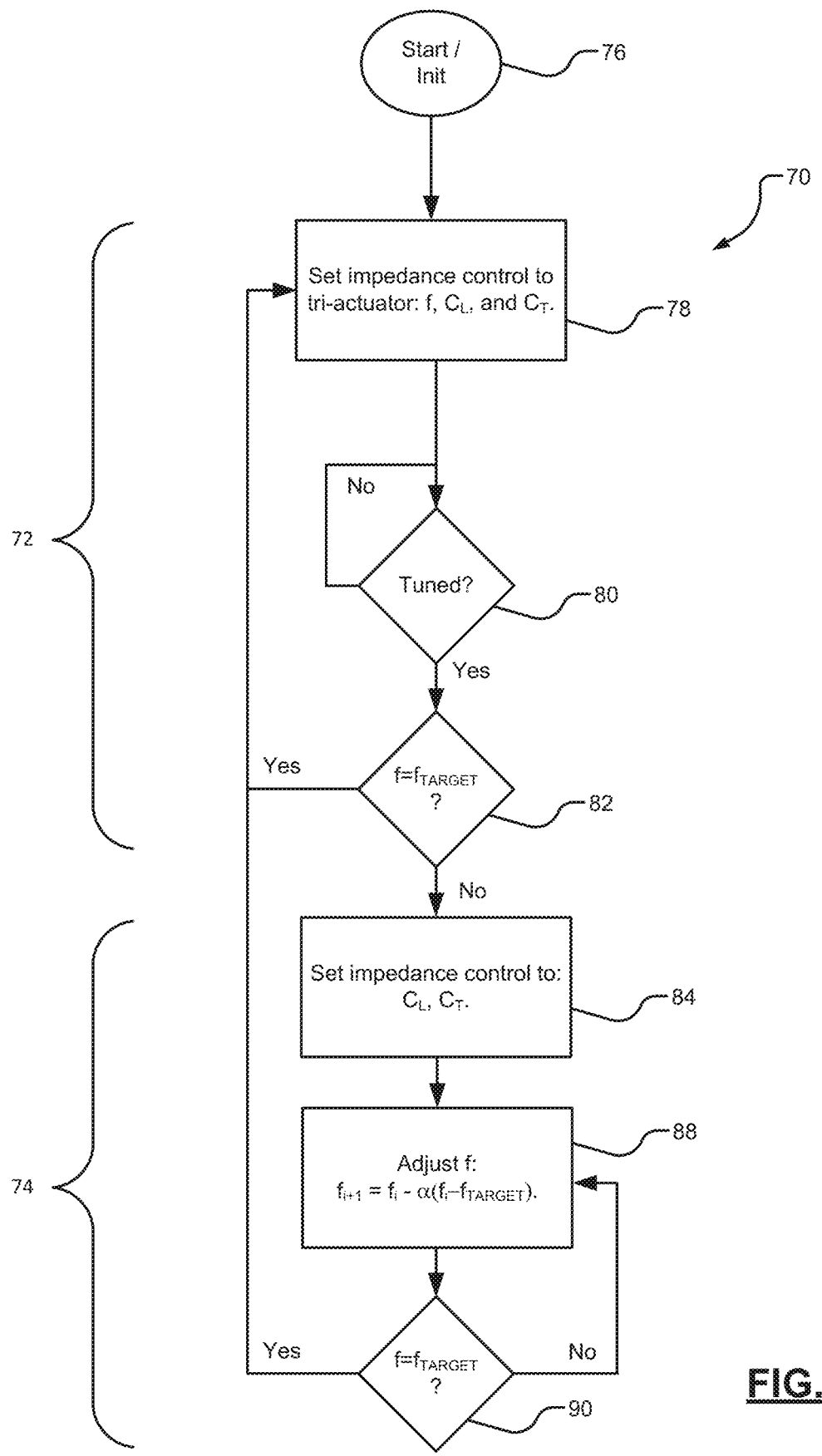
FIG. 4 depicts a flow diagram of a portion of the RF power delivery control system incorporating supervisory control of an RF impedance tuning operation.

FIG. 4 depicts a flow diagram of a control system for implementing the supervisory control of RF impedance tuning operations in accordance with the present disclosure. The supervisory process 70 includes process blocks directed to a first mode of operation 72 and process blocks directed to a second mode of operation 74. In the first mode of operation, a controller, such as controller 28 of FIG. 1, controls impedance by adjusting the RF frequency, $C_L$, and $C_T$. Also during the first mode of operation 72, the center or target RF frequency $f_{TARGET}$ is maintained generally constant. Thus, the changes in RF frequency are directed to automatic frequency tuning to minimize an impedance mismatch, not to adjusting the center or target frequency. In the second mode of operation 74, the controller, such as controller 28 of FIG. 1, controls impedance by adjusting $C_L$ and $C_T$ and adjusts the RF frequency f to a target frequency, $f_{TARGET}$ while AFT is inhibited.

In FIG. 4, control begins at start block 76 in which various parameters are initialized. Control proceeds to block 78 which enables impedance match control by adjusting the RF frequency f to enable AFT, the load capacitor $C_L$, and the tune capacitor $C_T$. Control proceeds to decision block 80 which determines if the RF power delivery system is tuned 10 within an acceptable range. If the RF power delivery system 10 is not tuned within an acceptable range, control returns to decision block 80 and any of the three impedance control may actuators f, $C_L$, and $C_T$ may be adjusted in order to adjust for an impedance improved match.

Once it is determined at decision block 80 that RF power delivery system 10 is tuned within an acceptable range, control proceeds to decision block 82. At decision block 82, the current RF frequency is compared to the target RF frequency as shown below in equation (4):

$$f=f_{TARGET} \tag{4}$$

where, f is the present RF frequency in the first mode 72 used to obtain a tune or impedance match in the first mode 72; and $f_{TARGET}$ is the desired target or center frequency. If $f=f_{TARGET}$, control returns to block 78. If $f \neq f_{TARGET}$, control proceeds to the second mode of operation 74. One skilled in the art will recognize that at decision block 82, the quantities f and $f_{TARGET}$ can be defined within an acceptable range, and need not be an exact equality.

In the second mode of operation 74, controller 28 disables AFT and enables impedance tuning using only impedance tuning elements 56, 58 of matching network 14. Controller 28 iteratively adjusts the tuned frequency f towards the target or center frequency $f_{TARGET}$ using power control module 40. Power control module 40 provides iterative computations for frequency updates. In various implementations, power control module 40 is a PID controller or subset thereof with a function identified as identified as $DP_{fb}^{P}(z)$.

Control proceeds to block 84. In block 84, controller 28 of FIG. 1 enables impedance control by adjusting only the load capacitor $C_L$ and the tune capacitor $C_T$. In block 84, impedance tuning by adjusting the RF frequency f is inhibited. Control proceeds to block 88 in which the RF frequency is adjusted toward the center or target or center frequency in accordance with equation (5):

$$f_{i+1}=f_i-\alpha(f_i-f_{TARGET}) \tag{5}$$

where $f_{i+1}$ is the frequency of the RF signal for the next iteration;

$f_i$ is the frequency of the RF signal for the present iteration;

α is a variable or constant term for the control equation; and $f_{TARGET}$ is as described above.

Once the RF frequency f is adjusted to $f_{i+1}$, control proceeds to block 90 which determines whether the frequency f is equal to $f_{TARGET}$ or within an acceptable predetermined range of $f_{TARGET}$, as shown in equation (4). If the frequency f is not equal to $f_{TARGET}$ or within an acceptable predetermined range of $f_{TARGET}$, control returns to block 88 in which the next iteration of $f_{i+1}$ is determined. If frequency f is equal to $f_{TARGET}$ or within an acceptable predetermined range of $f_{TARGET}$, control returns to block 78 of first mode 72, and controller 28 enables both frequency tuning and adjustment of tuning elements 56, 58 of tuning network 48 to maintain a match condition.

Returning to block 88, in which the RF frequency is adjusted toward the center or target frequency, at block 88 an error term is calculated at shown below in equation (6):

$$e_i=f_i-f_{TARGET_i} \tag{6}$$

where $e_i$ is the error term for the $i^{th}$ iteration;

$f_{TARGET_i}$ is the target or center frequency of the RF signal for the $i^{th}$ iteration of adjusting the frequency $f=f_{TARGET}$ toward the target frequency; and $f_i$ is as described above.

For a simple proportional control approach, the update computation can be described as in equation (7):

$$f_{i+1}=f_i+\alpha e_i \tag{7}$$

where $f_{i+1}$, $f_i$, α, and $e_i$ are as described above Substituting equation (6) into equation (7), yields equation (5).

Equation (7) above represents a simple proportional control approach. In order to minimize steady-state error and control higher order dynamics, the order of power control module 40 can be increased to include integral or derivative terms, or both. A generalization a power control module 40 can be described as shown in equation (8):

$$f_{(i+1)}=f_i+G[\alpha e_i+\beta e_{i-1}+\gamma e_{i-2}] \tag{8}$$

where $f_{i+1}$, $f_i$, and α are as described above, $e_{i-1}$ and $e_{i-2}$ are the first and second respective prior error terms, and G, β, and γ are variable or constant terms for the control equation.

In various embodiments, the controller terms are selected to expeditiously return f to $f_{TARGET}$ while avoiding reflected power perturbations in the process.

Figure 5:
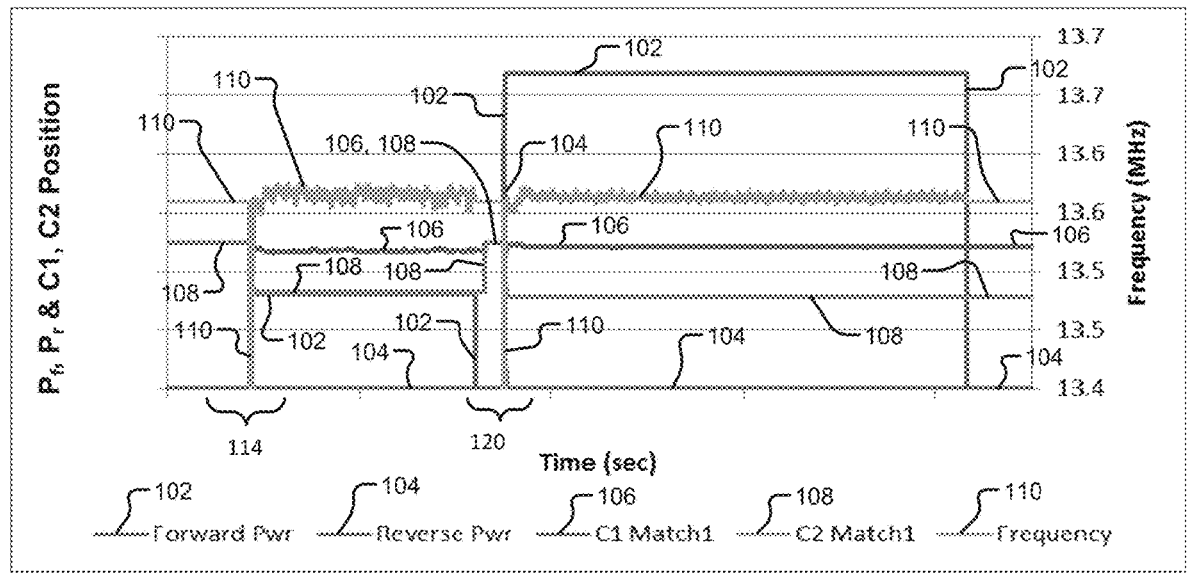
FIG. 5 depicts multiple waveforms providing an example of a system controlled according to the supervisory control of the RF impedance tuning operation in accordance with the present disclosure.
Figure 6:
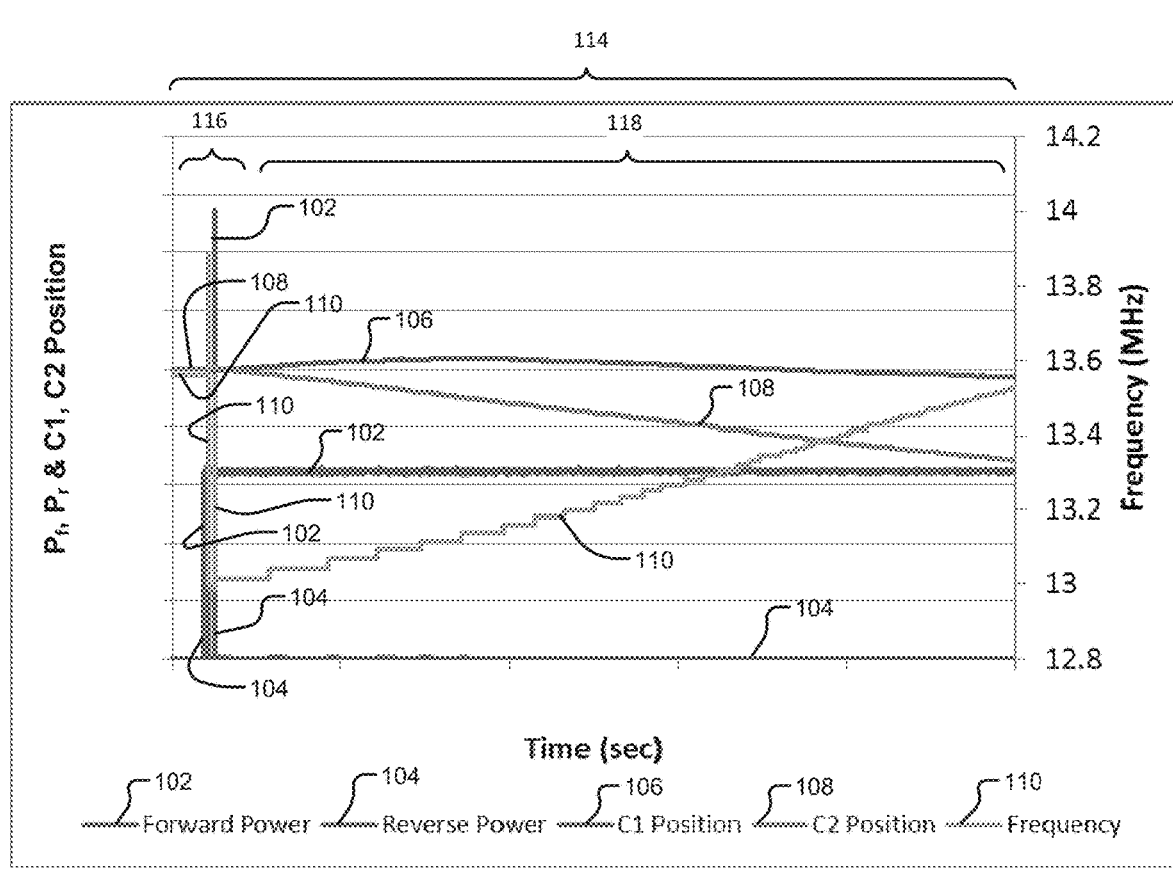
FIG. 6 depicts an expanded view of a selected portion of the multiple waveforms of FIG. 5.

FIGS. 5 and 6 provide a non-limiting example of waveforms resulting when applying the supervisory control of RF impedance tuning described herein. The waveforms shown FIGS. 5 and 6 include forward power 102, reverse power 104, C1 position 106, C2 position 108, and RF frequency 110. Multiple instances of each reference number are used to depict the waveforms in order to clarify the various transitions of each waveform. The left vertical axis of FIGS. 5 and 6 depicts forward power $P_f$ and reverse power $P_r$ and C1 position and C2 position. The right vertical axis of FIGS. 5 and 6 depicts frequency in megahertz (MHz).

FIG. 6 provides an expanded view of segment 114 depicted in FIG. 5. FIG. 6 shows a different time scale on the horizontal axis than is shown in FIG. 5. While both FIGS. 5 and 6 have horizontal axes measuring time, FIG. 6 is reset to 0 seconds based upon a different sampling rate to provide improved resolution for segment 114. FIG. 6 also depicts example waveforms in segment 116 when the supervisory control of RF impedance tuning described in the present disclosure operates in the first mode 72 of FIG. 4. Likewise, FIG. 6 depicts exemplary waveforms in segment 118 when the supervisory control of RF impedance tuning described in the present disclosure operates in the second mode 74 of FIG. 4.

In segment 116 of FIG. 6, the frequency 110, C1 position 106, and C2 position 108 can all be adjusted to achieve a match, thereby minimizing reverse power 104. As can be seen in segment 116, an increase in reverse power 104 causes a corresponding change in the frequency 110. The change in frequency is most notable in FIG. 6 in which the frequency 110 starts out at approximately 13.56 MHz, increases to a maximum of approximately 13.9 MHz, then drops to approximately 13.0 MHz. Near the right portion of segment 116, reverse power 104 has returned to zero, and the forward power 102 has stabilized. The right portion of segment 116 indicates that that in a first mode 72, decision block 80 had detected an impedance match, as indicated by a drop in reverse power 104.

Near the right portion of segment 116, control proceeds to block 82 which determines whether $f=f_{TARGET}$. In the example waveforms shown in FIGS. 5 and 6, the target or center frequency is 13.56 MHz. Therefore, control proceeds to the second mode of operation 74 and, in particular, block 84. At block 84, impedance control is limited to actuators load capacitor $C_L$ and tune capacitor $C_T$, and varying the RF frequency in order to vary the impedance is inhibited. As can be seen at the left portion of segment 118, frequency 110 is incremented in steps, as shown in control block 88 and decision block 90 of 4, so that the frequency incrementally returns to 13.56 MHz over the remainder of segment 118. As can be seen in FIG. 6 in segment 118, load capacitor $C_L/C_1$ and tune capacitor $C_T/C_2$ are adjusted over the course of segment 118, to maintain an impedance match while transitioning the frequency back to the center or target frequency $f_{TARGET}$.

Once it is determined that $f=f_{TARGET}$, control returns to block 78 of FIG. 4, and impedance control is provided by three actuators f, $C_T$, and $C_L$. In FIG. 5, for example, automatic frequency tuning occurs in segment 120. As can be seen, the frequency reacts similarly to frequency in segment 114. Thus, Automatic frequency tuning occurs in segment 120 in a first mode 72 of operation. Frequency then returns to a target or center frequency $f_{TARGET}$ during a second mode 74 of operation, as can be seen near the right of segment 120.

In various embodiments, the system of the present disclosure enables continuous operation of a plasma without extinguishing the discharge. During periods when the RF signal is off, it is possible for particles to fall onto the wafer. With continuous RF power during recipe transitions, opportunities for particle contamination are minimized. Further, it is generally desirable that semiconductor fabrication operations produce high yields. High yields typically result from highly repeatable RF power systems providing desirable performance characteristics. One measure for RF power delivery is minimization of RF reflected power during recipe transitions. Reflected power occurring during transitions cause a variation in thin film processing. The supervisory control approach described here in enables continuous operation with fast tuning actuators in conjunction with correcting the tuning actuators to preferred positions without adversely affecting RF power coupling to the discharge. Thus, the supervisory control system of the present disclosure provides a repeatable system with lower cost and complexity. The present disclosure also enables impedance tuning during frequency correction and transitions, while still allowing fast automatic frequency tuning for process correction. Further, system of the present disclosure enables updating a target frequency while the tuning elements of a matching network performed impedance tuning so that the target frequency can be reached without adversely affecting the impedance match.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A method for controlling a radio frequency (RF) system having a RF generator comprising:
    generating a RF signal and varying a frequency of the RF signal; and
    in a first mode of operation, when the RF signal is at a first target frequency, adjusting the frequency of the RF signal to adjust an impedance match between the RF generator and a load and adjusting an impedance tuning element of a matching network to provide an impedance match between the RF generator and the load, and
    in a second mode of operation, adjusting the impedance tuning element to provide an impedance match between the RF generator and the load and also inhibiting adjusting the frequency of the RF signal to adjust the impedance match, while adjusting the frequency of the RF signal from the first target frequency to a second target frequency.

2. The method for controlling the RF system of claim 1, wherein in the first mode of operation, adjusting the frequency of the RF signal includes adjusting the frequency of the RF signal within a predetermined range about a target frequency.

3. The method for controlling the RF system of claim 2, wherein in the first mode of operation, adjusting the frequency of the RF signal includes adjusting the frequency of the RF signal to vary the impedance match.

4. The method for controlling the RF system of claim 3, wherein in the second mode of operation, adjusting the adjusting the frequency of the RF signal from a first target frequency to a second target frequency without reference to the impedance match.

5. The method for controlling the RF system of claim 4 wherein in the first mode of operation, adjusting the frequency of the RF signal to provide an impedance match includes automatic frequency tuning (AFT).

6. The method for controlling the RF system of claim 1, wherein in the second mode of operation, the frequency of the RF signal from a first target frequency to a second target frequency occurs without reference to the impedance match.

7. The method for controlling the RF system of claim 6, wherein in the first mode of operation, adjusting the frequency of the RF signal to adjust an impedance match includes adjusting the frequency within a predetermined range about a target frequency.

8. The method for controlling the RF system of claim 1 wherein in the first mode of operation, adjusting the impedance tuning element includes adjusting at least one of a load element of the matching network or a tune element of the matching network.

9. The method for controlling the RF system of claim 1 wherein in the second mode of operation, inhibiting adjusting the frequency of the RF signal to provide an impedance match includes disabling automatic frequency tuning (AFT).

10. The method for controlling the RF system of claim 1 further comprising operating the RF generator in a continuous wave mode or a pulse mode.

11. A radio frequency (RF) control system comprising:
    a RF generator including a power amplifier that outputs a RF signal, the RF generator generating a RF output signal to a matching network, the matching network receiving the RF signal, the matching network including an impedance tuning element; and
    a controller varying a frequency of the RF signal and communicating commands to the matching network to adjust a tuning element that varies an impedance between a RF generator and a load, the controller operating the RF generator in one of two modes of operation, wherein
    in a first mode of operation, when the RF signal is at a first target frequency, the controller both applies automatic frequency tuning (AFT) and adjusts the tuning element to vary an impedance match between the RF generator and a load, and
    in a second mode of operation, as the frequency of the RF signal is adjusted from the first target frequency to a second target frequency, the controller controls the impedance tuning element to vary the impedance match and inhibits AFT or the controller controls the impedance tuning element to vary the impedance match.

12. The RF control system of claim 11, wherein in the first mode of operation, when the controller applies AFT, the frequency is adjusted within a predetermined range about a target frequency.

13. The RF control system of claim 12, wherein in the second mode of operation, the controller adjusts the frequency to the second target frequency without reference to the impedance match.

14. The RF control system of claim 13, wherein in the first mode of operation, when applying AFT, the controller adjusts the frequency about the target frequency to vary the impedance match.

15. The RF control system of claim 12, wherein when applying AFT, the controller adjusts the frequency about the target frequency to vary the impedance match.

16. The RF control system of claim 11, wherein in the second mode of operation, the controller adjusts the frequency to a target frequency without reference to the impedance match.

17. The RF control system of claim 16, wherein in the first mode of operation, the controller applies AFT to adjust the frequency about the target frequency to vary the impedance match.

18. The RF control system of claim 16, wherein in the second mode of operation, the controller adjusts the frequency to the second target frequency without reference to the impedance.

19. The RF control system of claim 11 wherein the RF generator operates in a continuous wave mode or a pulse mode.

20. The RF control system of claim 11 wherein the tuning element includes a load element and a tune element, and in the first and second modes of operation, the controller adjusts at least one of the load element and the tune element.

21. A controller for a radio frequency (RF) control system operable in one of two modes wherein a first mode of operation, when the RF signal is at a first target frequency, the controller adjusts a frequency of a RF signal to provide an impedance match between an RF generator and a load and adjusts a tuning element to vary the impedance match between the RF generator and the load and a second mode of operation in which the controller adjusts the tuning element to vary an impedance match between the RF generator and the load, while adjusting the frequency of the RF signal from the first target frequency to a second target frequency.

22. The controller of claim 21 wherein in the first mode of operation, the controller adjusts the frequency of the RF signal and the tuning element to vary the impedance match between the RF generator and the load and in the second mode of operation, the controller adjusts only the tuning element to vary the impedance match between the RF generator and the load.

23. The controller of claim 22 wherein the tuning element includes a load element and a tune element, and in the first and second modes of operation, the controller adjusts the load element and the tune element.

24. The controller of claim 23 wherein in the first mode of operation, the controller adjusts the frequency of the RF signal and at least one of the load element or the tune element to vary the impedance match between the RF generator and the load.

25. The controller of claim 21, wherein in the first mode of operation, the controller adjusts the frequency of the RF signal within a predetermined range about a target frequency.

26. The controller of claim 21, wherein in the second mode of operation, the controller adjusts the frequency of the RF signal without reference to the impedance match.

27. A controller for a radio frequency (RF) control system, the RF control system including a RF generator having a power amplifier that outputs a RF signal to a matching network, the matching network receiving the RF signal, the matching network including at least one tuning element that varies an impedance between the RF generator and a load, the controller varying a frequency of the RF signal and communicating commands to the matching network to adjust the tuning element, wherein:
in a first mode of operation, when the RF signal is at a first target frequency, the controller adjusts the frequency of the RF signal and adjusts the tuning element to provide an impedance match between the RF generator and a load, and
in a second mode of operation, the controller adjusts the tuning element to provide an impedance match between the RF generator and the load and also inhibits adjusting the frequency of the RF signal to adjust the impedance match, while adjusting the frequency of the RF signal from the first target frequency to a second target frequency.

28. The controller of claim 27, wherein in the first mode of operation, the frequency is adjusted within a predetermined range about a target frequency.

29. The controller of claim 28, wherein in the second mode of operation, the controller adjusts the frequency without reference to the impedance match.

30. The controller of claim 27, wherein in the second mode of operation, the controller adjusts the frequency without reference to the impedance match.

31. The controller of claim 30, wherein in the first mode of operation, the frequency is adjusted within a predetermined range about a target frequency.

32. The controller of claim 27 wherein in the first mode of operation, the controller adjusts the frequency of the RF signal to provide an impedance match using automatic frequency tuning (AFT).

33. The controller of claim 32 wherein in the second mode of operation, the controller inhibits adjusting the frequency of the RF signal to adjust an impedance match by inhibiting automatic frequency tuning (AFT).

34. The controller of claim 27 wherein the tuning element includes a load element and a tune element, and in the first and second modes of operation, the controller adjusts at least one of the load element and the tune element.

35. The controller of claim 27 wherein the RF generator operates in a continuous wave mode or a pulse mode.

* * * * *